(12) United States Patent
Koide et al.

(10) Patent No.: US 7,884,372 B2
(45) Date of Patent: Feb. 8, 2011

(54) DIAMOND UV-RAY SENSOR

(75) Inventors: Yasuo Koide, Ibaraki (JP); Meiyong Liao, Ibaraki (JP); Jose Antonio Alvarez, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 489 days.

(21) Appl. No.: 11/997,671

(22) PCT Filed: Jul. 28, 2006

(86) PCT No.: PCT/JP2006/314996

§ 371 (c)(1),
(2), (4) Date: Feb. 1, 2008

(87) PCT Pub. No.: WO2007/015431

PCT Pub. Date: Feb. 8, 2007

(65) Prior Publication Data

US 2010/0090226 A1    Apr. 15, 2010

(30) Foreign Application Priority Data

Aug. 1, 2005   (JP)   .............................. 2005-222340

(51) Int. Cl.
*H01J 3/02* (2006.01)
(52) U.S. Cl. ................. 257/77; 257/E31.011
(58) Field of Classification Search ............ 257/77, 257/E31.011
See application file for complete search history.

(56) References Cited

U.S. PATENT DOCUMENTS 5,250,149 A * 10/1993 Kimoto et al. ............... 117/97

(Continued)

FOREIGN PATENT DOCUMENTS

JP    58-110494 A    7/1983

(Continued)

OTHER PUBLICATIONS

International Search Report of PCT/JP2006/314996, date of mailing Aug. 29, 2006.

(Continued)

*Primary Examiner*—Thomas L Dickey
(74) *Attorney, Agent, or Firm*—Westerman, Hattori, Daniels & Adrian, LLP

(57) ABSTRACT

Au base electrode materials have fatal disadvantages, such as inferior adhesion to diamond, low mechanical strength, and low thermal stability.

A diamond UV sensor is provided which includes a photoconductive or Schottky optical sensor element having two-terminal electrodes and detects light irradiating a light-receiving portion according to the changes in electrical resistance or photo-induced current of the material of the light-receiving portion. The sensor element includes diamond having a surface from which a conductive surface layer has been removed, and the surface of the diamond is used as the light-receiving portion and a junction interface with the electrodes. The electrodes include a rectifying and an ohmic electrode. The rectifying electrode is transparent electrode capable of transmitting light and is defined by a single layer made of a nitride of a refractory metal element. The ohmic electrode includes a first layer made of a reactive elementary metal that can react with diamond to form a carbide or a carbon-containing solid solution, and a second layer made of a nitride of a refractory metal element.

2 Claims, 3 Drawing Sheets

U.S. PATENT DOCUMENTS

2002/0047562 A1* 4/2002 Kitamura et al. ......... 315/169.3

FOREIGN PATENT DOCUMENTS

| JP | 59-27754 A | 2/1984 |
| JP | 6-275552 A | 9/1994 |
| JP | 11-97721 A | 4/1999 |
| JP | 11-248531 A | 9/1999 |

OTHER PUBLICATIONS

R. Koshiba et al.; 31p-Q-2, Dai 2 Bunsatsu, p. 694. Cited in the ISR, dated 2005.

M. Werner et al.; "How to fabricate low-resistance metal-diamond contacts", Function & materials, vol. 5, Cited in the ISR. dated 1996.

Y. Koide et al.; "Diamond Ultraviolet Light Sensor", Function & materials, vol. 26, No. 2, pp. 25-34, 2006. Cited in the ISR.

H. J. Looi et al.; "Metal-semiconductor-metal photodiodes fabricated from thin-film diamond"; Applied Physics Letters, vol. 74, No. 22, pp. 3332-3334, May 31, 1999.

R. D. McKeag et al.; "Diamond UV photodetectors: sensitivity and speed for visible blind applications"; Elsevier, Diamond and Related Materials, vol. 7, pp. 513-518, 1998.

M. D. Whitfield et al.; "Thin film diamond photodiode for ultraviolet light detection", Appl. Phys. Lett. Vol. 63, No. 3, pp. 290-292, Jan. 15, 1996.

* cited by examiner

DIAMOND UV-RAY SENSOR

TECHNICAL FIELD

The present invention relates to a diamond UV sensor.

BACKGROUND ART

It has been known that diamond semiconductor has quite a large band gap of about 5.5 eV (about 225 nm in terms of light wavelength) at room temperature and, thus, can be an insulator when it is in an intrinsic state not containing dopant (impurity). In order to grow its single crystal thin film, a microwave-excited plasma chemical vapor deposition method using an atmosphere substantially containing carbon and hydrogen, such as $CH_4$ (methane) and $H_2$ (hydrogen) gases, has been developed (Patent Document 1) and widely applied. In the microwave-excited plasma chemical vapor deposition, p-type (in which holes are main carrier) conductivity is often controlled by adding B (boron) as dopant.

It is known that since the microwave-excited plasma chemical vapor deposition uses an atmosphere containing hydrogen, the surface of the resulting diamond single crystal film is substantially covered with hydrogen. More specifically, it is known that a C—H molecular structure formed by terminating unbonded hands of carbon atoms (C) with hydrogen atoms (H) (hereinafter referred to as "hydrogenation") is present at the surface, and that a conductive surface layer in which holes acting as the main carrier are localized close to the surface (at a depth within 2 nm) is formed inside the diamond close to the surface of the diamond by the hydrogenation. It is also known that undoped or boron-doped (100) and (111) plane single crystal thin films and polycrystalline thin films have such an electroconductive surface layer.

The mechanism how the conductive surface layer is formed is being actively discussed in the world, and it has been found at least according to experimental studies that the conductive surface layer is: (1) stable up to about 200° C.; and (2) formed only in the hydrogenated diamond surface. It has been also found that the conductive surface layer disappear by treatment (oxidation) with a solution removing the bonded hydrogen from the surface, for example, by immersion in a boiling mixed solution of sulfuric acid and nitric acid. The inventors of the present invention have confirmed this.

For optical sensor elements that detect UV light irradiating a light-receiving portion according to the changes in electrical resistance or photo-induced current of the light-receiving portion, it has been proposed that Si semiconductors capable of detecting visible light having a wavelength in the range of 400 to 650 mm, or $Al_xGa_{1-x}N$ semiconductors ($0 \leq X \leq 1$) or diamond semiconductors having no detection sensitivity to the visible light or optical noises in the infrared region are used as solid materials of the light-receiving portion.

In the optical detection principle of such optical sensor elements, electron-hole pairs are formed in the semiconductor of the light-receiving portion by irradiating the semiconductor to light having an energy more than or equal to the band gap, and the electron-hole pairs being carriers change the electrical resistance and photo-induced current of the semiconductor. The sensor detects these changes. Accordingly, the sensor element can have a simple two-terminal structure in which two electrodes are bonded to the semiconductor, and, thus, the resulting UV sensor can be extremely simple.

Widely used optical sensor elements having a two-terminal element include a metal-semiconductor-metal (MSM) element having a comb-like electrode structure and a Schottky element having two types of electrodes: a rectifying electrode through which light is detected and an ohmic electrode.

Non-Patent Document 1 describes an example of the UV sensor element using a diamond semiconductor. This UV sensor element is a MSM type photoconductive sensor element including a light-receiving portion defined by a conductive surface layer of a polycrystalline diamond thin film, and a Ti first layer electrode and a Au second layer electrode, and has a detection sensitivity of 0.03 A/W to UV light of 200 nm.

Non-Patent Document 2 describes an MSM type photoconductive sensor element including a light-receiving portion made of a polycrystalline diamond film from which the conductive surface layer has been removed by oxidation, and a Ti first layer electrode and a Au second layer electrode. This MSM type photoconductive sensor element has a detection sensitivity of 0.02 A/W to UV-light of 200 nm.

Non-Patent Document 3 describes a Schottky sensor element including a Au rectifying electrode and a Ti/Ag/Au ohmic electrode (slash "/" represents deposition order) that are formed on a polycrystalline diamond thin film. Although the absolute value of the detection sensitivity of this element is unknown, it has been reported that the ratio of the detection sensitivity to light having a wavelength of 200 nm to the detection sensitivity to light having a wavelength of 600 nm (referred to as visible light blind ratio) is five digits.

Patent Document 2 has disclosed prior art relating to a diamond UV sensor including a light-receiving portion made of a 40 μm thick polycrystalline or (100) or (111) oriented diamond thin film having a surface from which bonded hydrogen has been removed. The detection sensitivity of this sensor is not insufficient for practical use. Patent Document 3 has disclosed a diamond UV sensor element including a light-receiving portion defined by a conductive surface layer of diamond. This element can detect light having wavelengths in the entire visible region, and is a photoconductive sensor element using the defect level of the diamond band gap. Hence, it cannot selectively detect UV light of 250 nm or less.

Patent Document 1: Japanese Examined Patent Application Publication No. 59-27754
Patent Document 2: Japanese Unexamined Patent Application Publication No. 11-248531
Patent Document 3: Japanese Unexamined Patent Application Publication No. 11-097721
Non-Patent Document 1: H. J. Looi, M. D. Whitfield, and R. B. Jackman, Appl. Phys. Letts. 74, 3332 (1999)
Non-Patent Document 2: R. D. McKeag and R. B. Jackman, Diamond Relat. Mater. 7, 513 (1998)
Non-Patent Document 3: M. D. Whitfield, S. S M. Chan, and R. B. Jackman, Appl. Phys. Lett., 68, 290(1996)

DISCLOSURE OF INVENTION

Problems to be Solved by the Invention

Known UV sensor elements using a diamond semiconductor as the light-receiving portion use electrodes including Au as the base (Au base electrode material) represented by Ti/Au (slush "/" represents deposition order) for both the rectifying electrode and the ohmic electrode. However, the Au base electrode material has fatal disadvantages, such as inferior adhesion to diamond, low mechanical strength, and low thermal stability.

Means For Solving the Problems

The present invention provides an extremely thermally stable diamond UV sensor having a detection sensitivity to UV light having a wavelength of 260 nm or less which includes a rectifying and/or an ohmic electrode made of a refractory metal nitride (TiN, ZrN, HfN, VN, NbN, TaN, CrN, MoN, or WN) and which is not complicated in element structure, taking advantages of photoconductive or Schottky sensor elements.

More specifically, an optical sensor element and a flame sensor or UV sensor using the optical sensor element are provided. The optical sensor detects UV light having a wavelength of 260 nm or less irradiating a light-receiving portion according to the changes in electrical resistance or photo-induced current of the light-receiving portion, and exhibits extremely low detection sensitivity to visible light having a wavelength of 400 nm or more. Photoconductive, pn-type, pin-type, and Schottky UV sensor elements have been industrially available. The present invention relates a photoconductive or Schottky sensor element having two-terminal electrodes.

The present invention provides: (1) a diamond UV sensor including a photoconductive or Schottky optical sensor element having two-terminal electrodes including a rectifying electrode and an ohmic electrode. The diamond UV sensor detects light irradiating a light-receiving portion according to the changes in electrical resistance or photo-induced current of the material of the light-receiving portion. The sensor element includes diamond having a surface from which a conductive surface layer has been removed. The surface of the diamond is used as the light-receiving portion and a junction interface with the electrodes. The rectifying electrode is a transparent electrode capable of transmitting light and is defined by a single layer made of at least one nitride selected from among the refractory metal nitrides consisting of TiN, ZrN, HfN, VN, NbN, TaN, CrN, MoN, and WN. The ohmic electrode includes a first layer made of a reactive elementary metal that can react with diamond to form a carbide or a carbon-containing solid solution, and a second layer made of at least one nitride selected from the refractory metal nitrides consisting of TiN, ZrN, HfN, VN, NbN, TaN, CrN, MoN, and WN.

The present invention also provides: (2) a diamond UV sensor including a photoconductive or Schottky optical sensor element having two-terminal electrodes and detecting light irradiating a light-receiving portion according to the changes in electrical resistance or photo-induced current of the material of the light-receiving portion. The sensor element includes diamond having a surface from which a conductive surface layer has been removed. The surface of the diamond is used as the light-receiving portion and a junction interface with the electrodes. At least one of the electrodes includes a layer made of at least one nitride selected from among the refractory metal nitrides consisting of TiN, ZrN, HfN, VN, NbN, TaN, CrN, MoN, and WN, and the layer is in contact with the surface of the diamond.

The present invention further provides: (3) a diamond UV sensor including a photoconductive or Schottky optical sensor element having two-terminal electrodes including an ohmic electrode. The sensor element detects light irradiating a light-receiving portion according to the changes in electrical resistance or photo-induced current of the material of the light-receiving portion. The sensor element includes diamond having a surface from which a conductive surface layer has been removed. The surface of the diamond is used as the light-receiving portion and a junction interface with the electrodes. The ohmic electrode has an uppermost layer made of at least one nitride selected from the refractory metal nitrides consisting of TiN, ZrN, HfN, VN, NbN, TaN, CrN, MoN, and WN.

The present invention also provides: (4) the diamond UV sensor according to any one of above (1), (2), and (3). The diamond surface from which the conductive surface layer has been removed is formed by oxidizing a hydrogen-terminated surface of the diamond.

ADVANTAGES

The diamond UV sensor of the present invention is extremely superior in thermal stability to the known diamond UV sensor having electrodes made of a composite or alloy containing Au, and exhibits a visible blind ratio of 5 digits. The photoconductive or Schottky UV sensor element has such thermally stable electrical and optical characteristics as are not degraded even by heat resistance test performed at 500° C. for 3 hours.

REFERENCE NUMERALS

Figure 1:
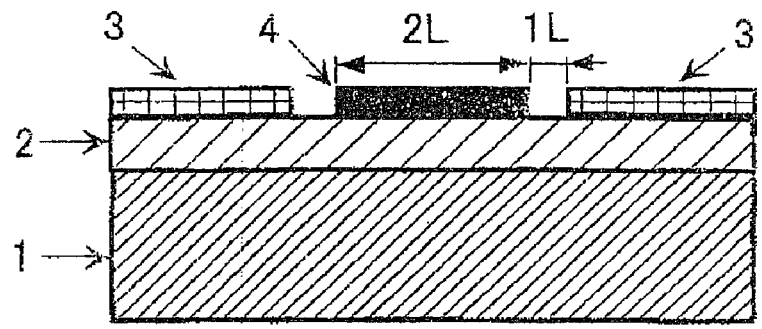
FIG. 1 is a sectional view of a diamond UV sensor according to the present invention.

1: (100) single crystal diamond substrate
2: single crystal diamond film
3: ohmic electrode
4: rectifying electrode

BEST MODE FOR CARRYING OUT THE INVENTION

An UV sensor of the present invention is a photoconductive or Schottky element having two-terminal electrodes. A rectifying electrode for diamond is made of a single layer of a nitride of refractory metal element, HfN (thickness: 5 nm), and an ohmic electrode has a double layer structure including a first layer of a metal reactive with diamond, such as Ti (thickness: 30 nm), and a second layer of a nitride of refractory metal element, HfN (thickness: 40 nm).

The rectifying electrode must be made of a single-layer refractory metal nitride that does not easily metallurgically react with diamond. The rectifying electrode must have a transmittance of at least 10% to 100% for deep UV light having a wavelength of 200 to 260 nm. This is because the optical detection is performed by use of an electric field in the space-charge region in the diamond in the vicinity of the rectifying electrode in contact with the diamond. More specifically, deep UV light transmitted through the rectifying electrode is absorbed by the space-charge region in the diamond layer formed directly under the electrode, and electron-hole pairs are formed to generate a photoelectric current.

Since metal nitrides, in general, absorb UV light and visible light, the optical transmittance of a metal nitride thin film needs to be increased by sufficiently reducing the thickness of the metal nitride thin film. In the Example, a 5 nm thick metal nitride thin film is used as the rectifying electrode. The optical transmittance is defined as the ratio of the intensity of light transmitted through a metal thin film to the intensity of light incident on the metal thin film. The optical transmittance of a thin film is measured by obtaining the ratio of the intensity of light transmitted through the thin film and the base substrate to the intensity of light transmitted through the base substrate. The Example uses single crystal sapphire as the base substrate of the metal nitride.

The ohmic electrode must have a double layer structure including a first layer made of an elementary metal that is allowed to react with diamond by heat treatment, and a second layer made of a refractory metal nitride or carbide that does not easily react with diamond by heat treatment. The ohmic electrode can be heat-treated in a vacuum or an argon gas atmosphere at a temperature of 500 to 800° C. Consequently, the reactive elementary metal forms a carbide or a carbon-containing solid solution in the vicinity of the junction interface between the diamond and the ohmic electrode.

In order to obtain an ohmic electrode exhibiting a linear current-voltage curve, the first layer in contact with the diamond can be made of a metal that is allowed to react with diamond to form a carbide or a carbon-containing solid solution by heat treatment, that is, an elementary metal reactive with diamond. For example, Ti is used in the Example. Which compound is formed at a certain temperature, a carbide or a carbon-containing solid solution, can be determined from the widely used carbon-metal binary phase diagram. For example, elementary metals capable of forming carbides, at different temperatures, include Zr, Hf, V, Nb, Ta, Cr, Mo, and W, in addition to Ti.

Refractory metal nitrides and carbides are extremely thermally stable intermetallic compounds having melting points of 1500° C. or more. In order to obtain a thermally stable UV sensor, reactive Ti metal exhibiting ohmic characteristics must be covered with a refractory metal nitride or a carbide.

A diamond semiconductor having high electrical and optical quality can be epitaxially grown on a high-pressure synthesized (100) or (111) plane single crystal diamond substrate by microwave-excited plasma chemical vapor deposition using $CH_4$ (methane) and $H_2$ (hydrogen) as raw material gases. For the epitaxial growth, the temperature of the substrate is preferably in the range of 800 to 950° C.

The same method is applied to the Example of the invention. However, a hydrogenated conductive surface layer is formed at the grown diamond surface, and the hydrogen-terminated surface of the diamond is oxidized to remove with a boiling sulfuric acid-hydrochloric acid solution. The resulting surface of the diamond from which the conductive surface layer has been removed is used as the junction interface between the light-receiving portion and the electrodes. Both the interfaces with the rectifying electrode and the ohmic electrode are defined by the surface of the diamond from which the conductive surface layer has been removed.

Figure 2:
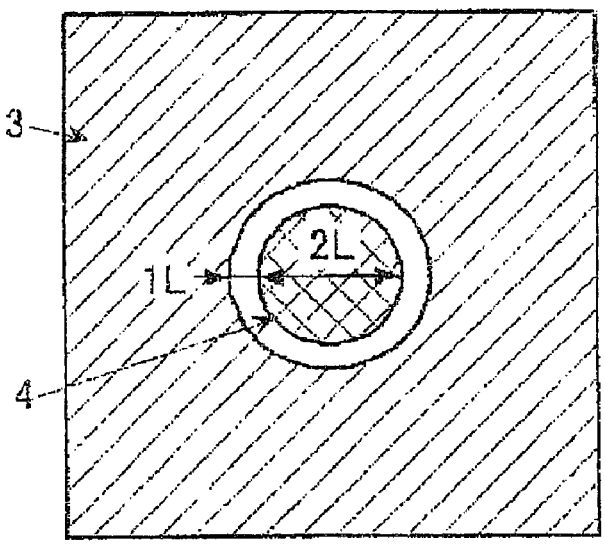
FIG. 2 is a plan view of an electrode pattern of the diamond UV sensor according to the present invention.

The photoconductive or Schottky sensor element of the present invention is prepared by forming the rectifying electrode and the ohmic electrode shown in FIGS. 1 and 2 on the oxidized surface. UV light and visible light having wavelengths of 220 to 600 nm are emitted to the diamond through the rectifying electrode, and thus the sensor element of the present invention achieves a visible light blind ratio of 5 digits.

Example 1

A Schottky sensor element shown in FIGS. 1 and 2 was prepared in the following process, and the current-voltage (I-V) characteristics and the optical response to UV light were measured.

As shown in FIG. 1, an epitaxial single crystal diamond film 2 doped with a p-type dopant element, B (boron), was grown to a thickness of 0.5 μm on a high-pressure synthesized (100) single crystal diamond substrate 1 of 2.5 mm in length by 2.5 mm in width by 0.5 mm in thickness containing nitrogen at a level of class Ib, by microwave-excited plasma chemical vapor deposition using $CH_4$ (methane) as a raw material gas, $H_2$ (hydrogen) as a dilution carrier gas, and 1 vol % (0.01) hydrogen-diluted $B(CH_3)_3$ (trimethyl boron) as a material gas of the dopant B.

In this process, the crystal growth progressed under the following conditions: substrate temperature of 800° C.; growing pressure of 80 Torr; microwave power of 360 W; and $CH_4$ flow rate of 500 sccm; $CH_4/H_2$ concentration ratio of 0.08% (vol); $B(CH_3)_3/CH_4$ concentration ratio of 3 (vol) ppm; and growing time of 8 hours.

The resulting (100) plane epitaxial single crystal diamond film 2 was oxidized by immersion in a boiling mixed solution of sulfuric acid and hydrochloric acid for 15 minutes to remove the conductive surface layer, followed by washing with overflowing ultrapure water. Subsequently, the diamond film 2 was subjected to ultrasonic cleaning in solutions of acetone and isopropyl alcohol. Then, a resist pattern for forming the Ti/HfN (slash "/" represents deposition order) electrode designated by reference numeral 3 in FIGS. 1 and 2 was formed by photolithography.

Subsequently, a Ti first layer (thickness: 30 nm) and then a HfN second layer (thickness: 40 nm) were deposited by sputtering Ti and HfN targets by magnetron sputtering using Ar gas, and a Ti/HfN electrode was produced by lift-off. The resulting Ti/HfN electrode was heat-treated in an Ar atmosphere at 600° C. for 1 hour, and thus the ohmic electrode was completed.

After subsequent washing with overflowing ultrapure water, a resist pattern was formed for the HfN electrode designated by reference numeral 4 in FIGS. 1 and 2 by photolithography. Then, HfN was deposited to a thickness of 5 nm by sputtering, and subjected to lift-off to form the HfN rectifying electrode.

Figure 3:
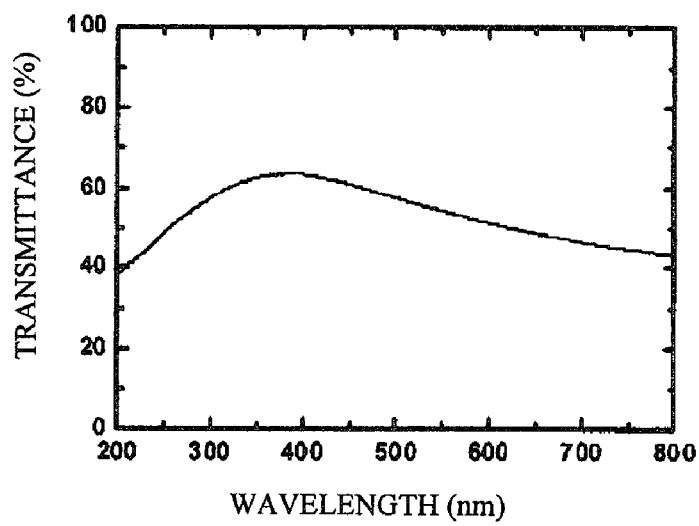
FIG. 3 is a graph showing a spectrum of measured transmittances of a HfN rectifying electrode in an Example.

The spectrum of measured transmittance of the 5 nm thick HfN thin film is shown in FIG. 3. For measuring the transmittance, a HfN thin film was deposited on a (0001) plane single crystal sapphire substrate by sputtering under the same conditions as those for forming the HfN electrode. The intensity spectrum of transmitted light was measured for wavelengths in the range of 200 to 800 nm, and the transmittance was defined as the relative value to the intensity spectrum of light transmitted through only the sapphire substrate. The HfN thin film has a transmittance of 40% to 50% for deep UV light having a wavelength of 200 to 260 nm, and the 5 nm thick HfN electrode can be transparent to deep UV light. Although the thickness was set at 5 nm in the Example, the thickness is not limited to this value as long as a transmittance of at least 10% is ensured.

The width between the Ti/HfN electrode and the HfN electrode (corresponding to 1L in FIGS. 1 and 2) was 10 μm and the diameter of the HfN electrode (corresponding to 2L in FIGS. 1 and 2) was 400 μm. For evaluating the thermal stability, the UV sensor was heat-treated in an Ar atmosphere, and the changes in electrical and optical characteristics were measured.

The resulting Schottky sensor element was placed in a vacuum chamber equipped with a two-short-needle prober. The inside of the chamber was maintained at a vacuum of 0.05 Pa with a turbo-molecular pump. The I-V characteristics were measured by a two-terminal method. The optical response was measured by irradiating the UV sensor element with light emitted from a xenon lamp, monochromized in the range of 220 to 600 nm through a spectroscope and passing through a quartz window.

Figure 4:
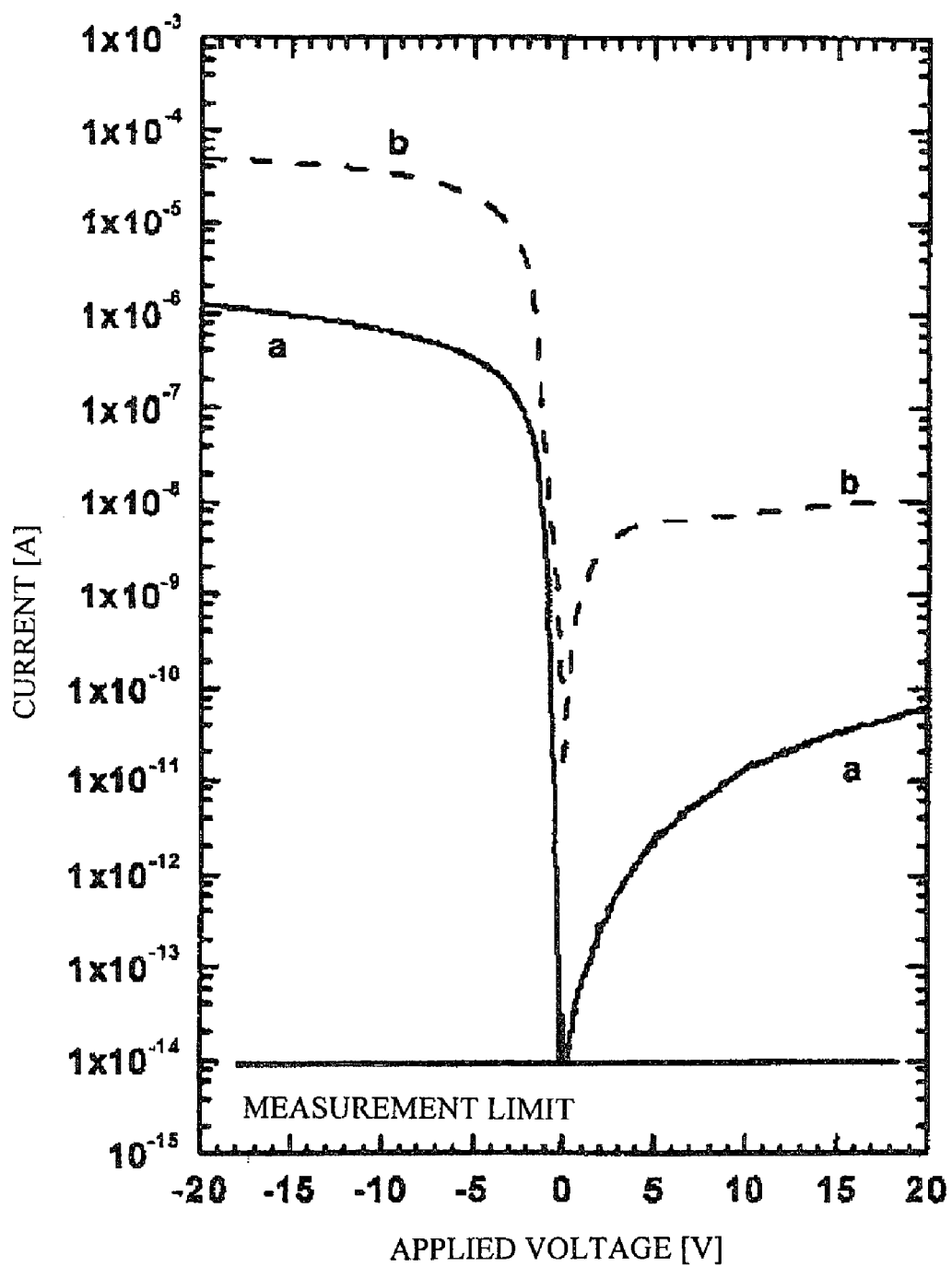
FIG. 4 is a graph showing: (a) a dark current I-V characteristics of a diamond UV sensor according to the present invention; and (b) a measured I-V characteristics of the diamond UV sensor when it is irradiated with UV light having a wavelength of 220 nm.

FIG. 4a shows the I-V characteristics of the sensor element before heat treatment measured in a darkroom where light was not emitted, and FIG. 4b shows the I-V characteristics measured while UV light having a wavelength of 220 nm was emitted. As shown by FIG. 4a, the reverse dark current of the element not irradiated with UV light was $10^{-10}$ A or less at a voltage of up to 20 V, and thus a low dark current was achieved. The rectification ratio to the forward current reached 4 digits or more, and thus superior Schottky characteristics were exhibited.

On the other hand, FIG. 4b shows that at least two digits higher photo-induced currents than reverse dark currents were obtained at reverse voltages of 2 V or more by irradiation of UV light having a wavelength of 220 nm. The I-V characteristics and the optical response were not changed even by heat treatment at 500° C. for 3 hours.

Figure 5:
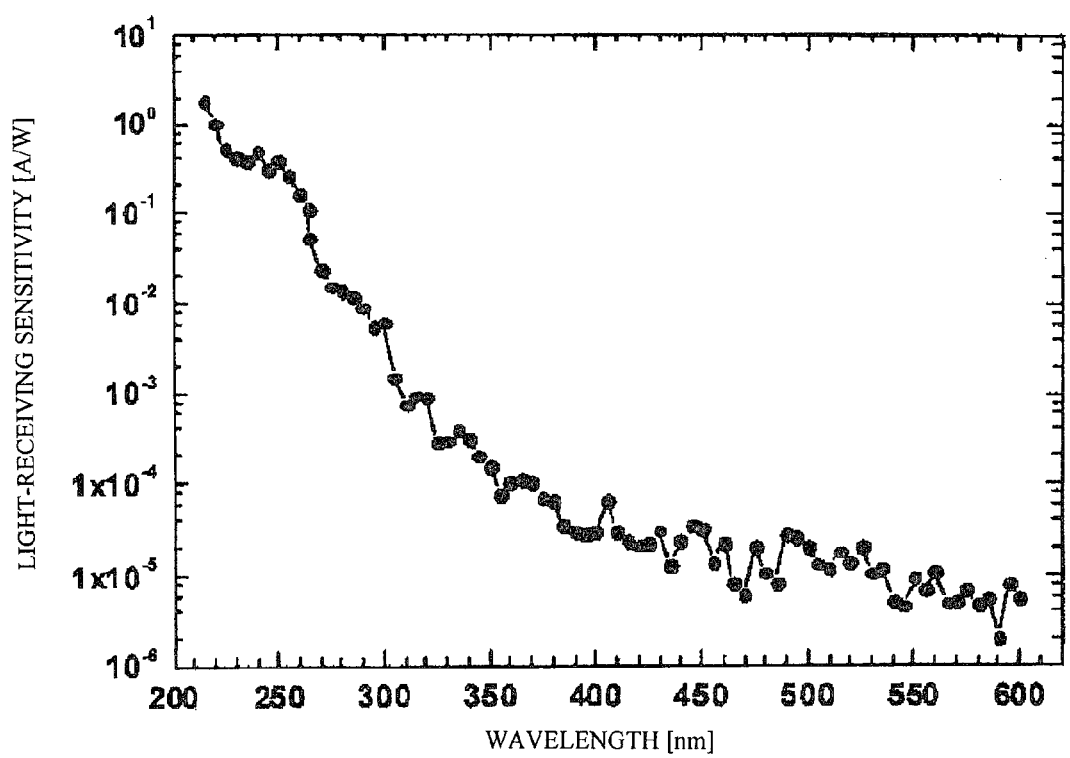
FIG. 5 is a representation of the optical response of the diamond UV sensor of the present invention after treatment at 500° C. for 1 hour.

FIG. 5 shows the optical response to light having wavelengths of 215 to 600 nm at a forward voltage of 2 V after heat treatment at 500° C. for 1 hour. As the wavelength is reduced, the light-receiving sensitivity is increased. The ratio of the light-receiving sensitivity to 220 nm UV light to the light-receiving sensitivity to 600 nm visible light (referred to as visible blind ratio) was about 5 digits.

INDUSTRIAL APPLICABILITY

The known diamond UV sensor element uses a composite or alloy containing Au as the electrode material. However, Au intermetallic compounds are extremely inferior in thermal stability and have low mechanical strength, and accordingly, the resulting UV sensor element is not thermally stabile. The present invention has developed a thermally stable electrode sufficient to operate even after being exposed to a high temperature of 500° C., and thus have achieved a thermally stable UV sensor.

The UV sensor element of the present invention can be applied to combustion control monitors of industrial combustion furnaces, gas-turbine engines and jet engines, flame sensors for flame detection combined with fire alarms, and UV sensors of steppers or UV exposing apparatuses used in the process for manufacturing silicon large-scale integrated circuits, thus developing new markets of semiconductor sensor elements.

The invention claimed is:

1. A diamond UV sensor including a photoconductive or Schottky optical sensor element having two-terminal electrodes including a rectifying electrode and an ohmic electrode, the sensor element detecting light irradiating a light-receiving portion according to the changes in electrical resistance or photo-induced current of the material of the light-receiving portion, the sensor element comprising:
   diamond having a surface from which a conductive surface layer has been removed, the surface of the diamond being used as the light-receiving portion and a junction interface with the electrodes,
   wherein the rectifying electrode is a transparent electrode capable of transmitting light and is defined by a single layer made of at least one nitride selected from among the refractory metal nitrides consisting of TiN, ZrN, HfN, VN, NbN, TaN, CrN, MoN, and WN, and
   wherein the ohmic electrode includes a first layer made of a reactive elementary metal that can react with diamond to form a carbide or a carbon-containing solid solution, and a second layer made of at least one nitride selected from among the refractory metal nitrides consisting of TiN, ZrN, HfN, VN, NbN, TaN, CrN, MoN, and WN.

2. A diamond UV sensor including a photoconductive or Schottky optical sensor element having two-terminal electrodes including an ohmic electrode, the sensor element detecting light irradiating a light-receiving portion according to the changes in electrical resistance or photo-induced current of the material of the light-receiving portion, the sensor element comprising:
   diamond having a surface from which a conductive surface layer has been removed, the surface of the diamond being used as the light-receiving portion and a junction interface with the electrodes,
   wherein the ohmic electrode has an uppermost layer made of at least one nitride selected from among the refractory metal nitrides consisting of TiN, ZrN, HfN, VN, NbN, TaN, CrN, MoN, and WN.

* * * * *